(12) United States Patent
Saito et al.

(10) Patent No.: US 7,102,104 B2
(45) Date of Patent: Sep. 5, 2006

(54) HEAT TREATMENT SYSTEM

(75) Inventors: Takanori Saito, Tokyo-To (JP); Kenichi Yamaga, Tokyo-To (JP); Ken Nakao, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/505,863

(22) PCT Filed: Nov. 25, 2002

(86) PCT No.: PCT/JP02/12280

§ 371 (c)(1),
(2), (4) Date: Aug. 27, 2004

(87) PCT Pub. No.: WO03/073487

PCT Pub. Date: Sep. 4, 2003

(65) Prior Publication Data

US 2005/0121432 A1 Jun. 9, 2005

(30) Foreign Application Priority Data

Feb. 28, 2002 (JP) .............................. 2002-054542
Jul. 9, 2002 (JP) .............................. 2002-200572

(51) Int. Cl.
*F27B 5/14* (2006.01)

(52) U.S. Cl. ...................... 219/390; 219/405; 219/411; 392/416; 392/418; 118/724; 118/725; 118/50.1

(58) Field of Classification Search ................ 219/390, 219/405, 411; 392/416, 418; 118/724, 725; 118/50.1

See application file for complete search history.

(56) References Cited

U.S. PATENT DOCUMENTS

| 6,369,361 B1 * | 4/2002 | Saito et al. ................. 219/390 |
| 6,414,277 B1 | 7/2002 | Nanbu et al. |
| 2001/0010307 A1 | 8/2001 | Takanori et al. |

FOREIGN PATENT DOCUMENTS

| JP | 08-195351 | * | 7/1996 |
| JP | 08-1953512 | * | 7/1996 |
| JP | 2000-100812 |   | 4/2000 |

(Continued)

OTHER PUBLICATIONS

Notification of Transmittal of Copies of Translation of the International Preliminary Examination Report (PCT/IB/338) issued for PCT/JP2002/012280.

(Continued)

*Primary Examiner*—Shawntina Fuqua
(74) *Attorney, Agent, or Firm*—Smith, Gambrell & Russell, LLP

(57) ABSTRACT

The present invention is a thermal processing unit that includes: a tubular processing container; an object-to-be-processed holding unit that holds a plurality of objects to be processed in a tier-like manner and that can be inserted into and taken out from the processing container; a process-gas introducing unit that introduces a predetermined process gas into the processing container; a heating unit provided in the processing container, the heating unit heating the plurality of objects to be processed held by the object-to-be-processed holding unit when the object-to-be-processed holding unit is inserted into the processing container; and a container cooling unit that cools an outside wall surface of the processing container.

17 Claims, 9 Drawing Sheets

FOREIGN PATENT DOCUMENTS

| | | | |
|---|---|---|---|
| JP | 2001-006853 | | 1/2001 |
| JP | 2001-102314 | * | 4/2001 |
| JP | 2001-210631 | | 8/2001 |
| JP | 2001-210649 | | 8/2001 |

OTHER PUBLICATIONS

International Preliminary Examination Report (PCT/IPEA/409) issued for PCT/JP2002/012280.

* cited by examiner

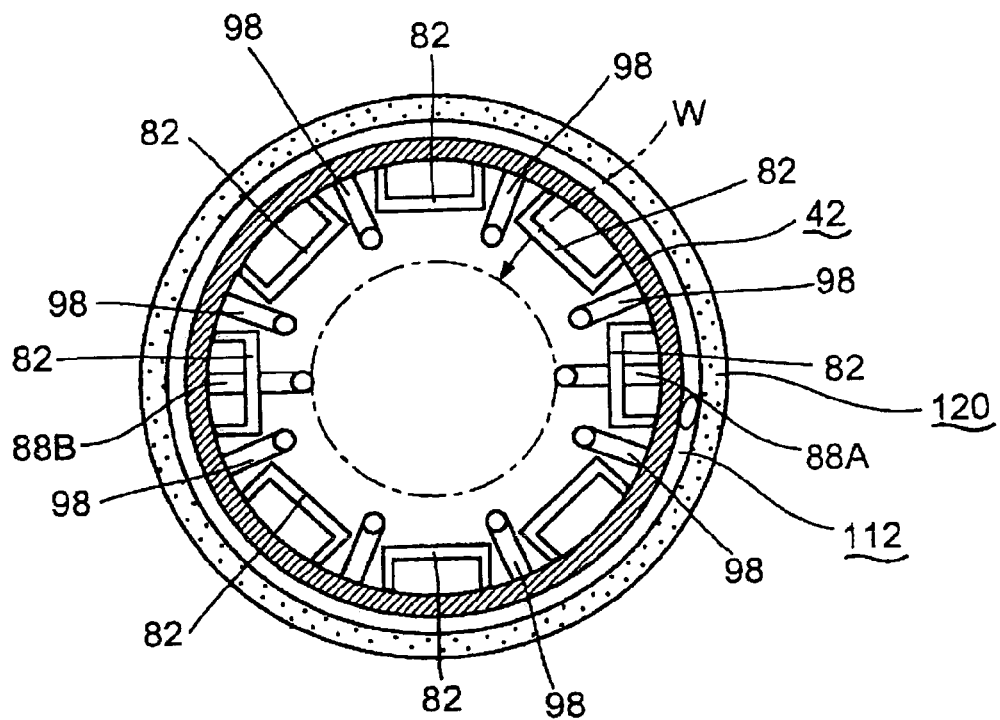
F I G. 2
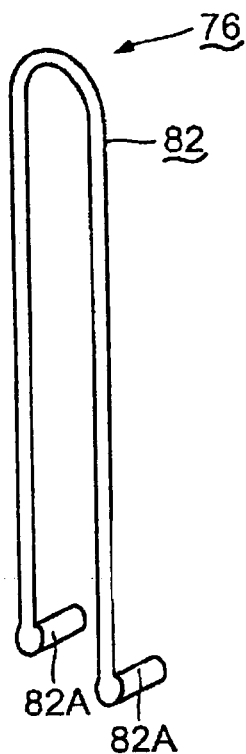
F I G. 3

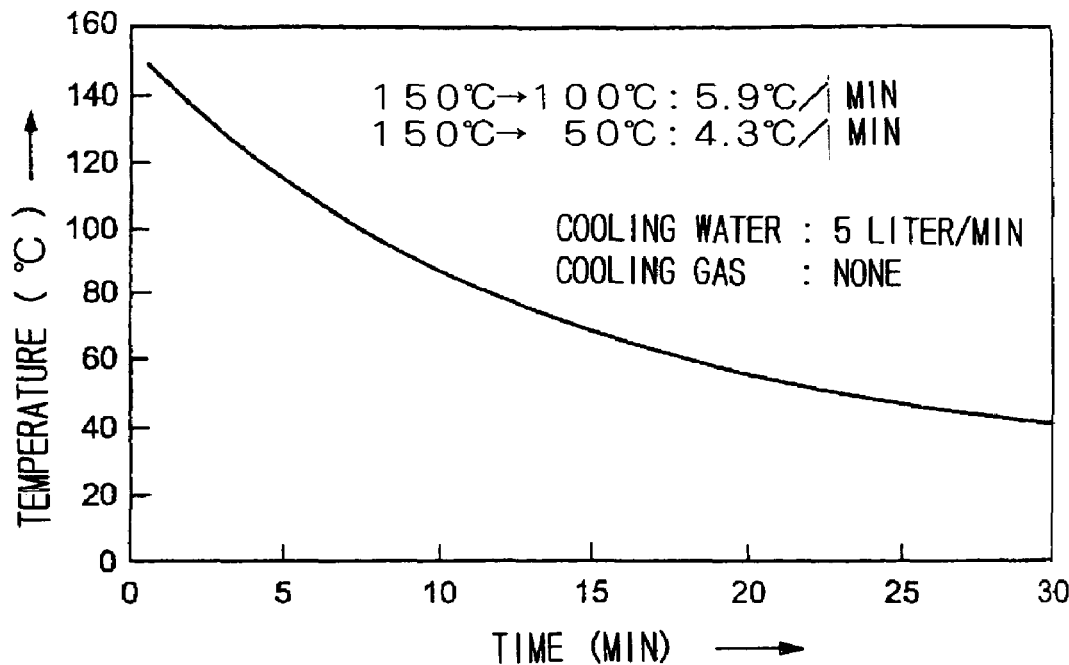
F I G. 4 (A)
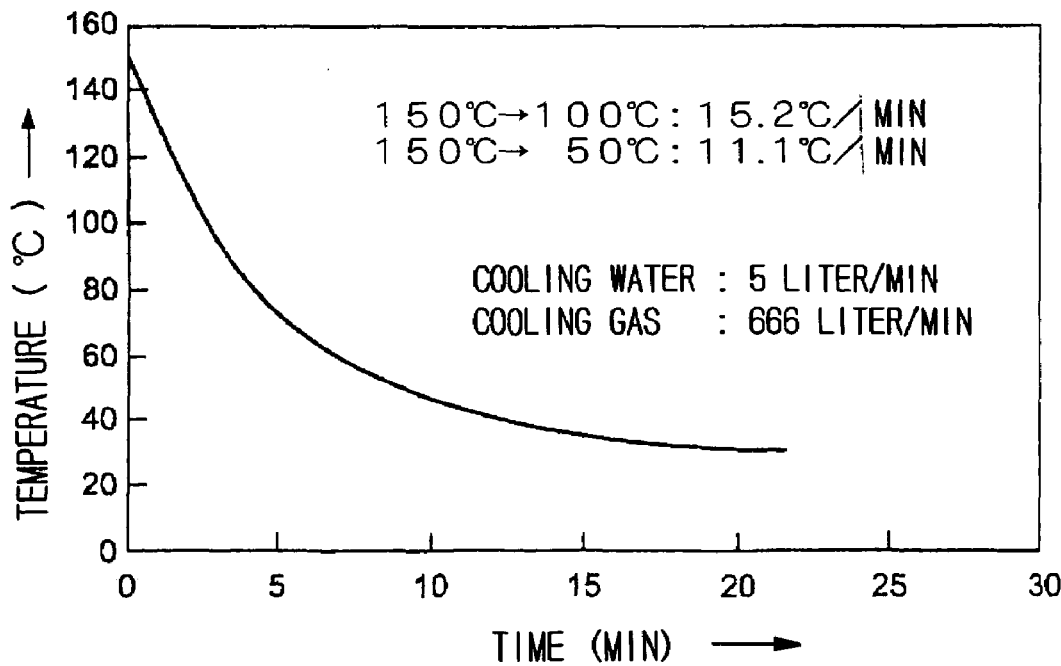
F I G. 4 (B)

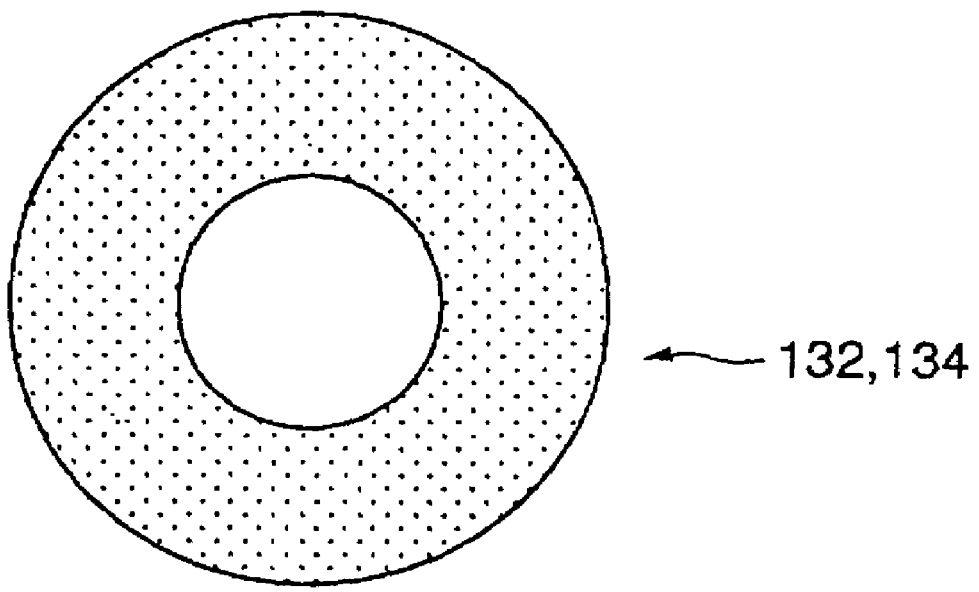
F I G. 7(A)
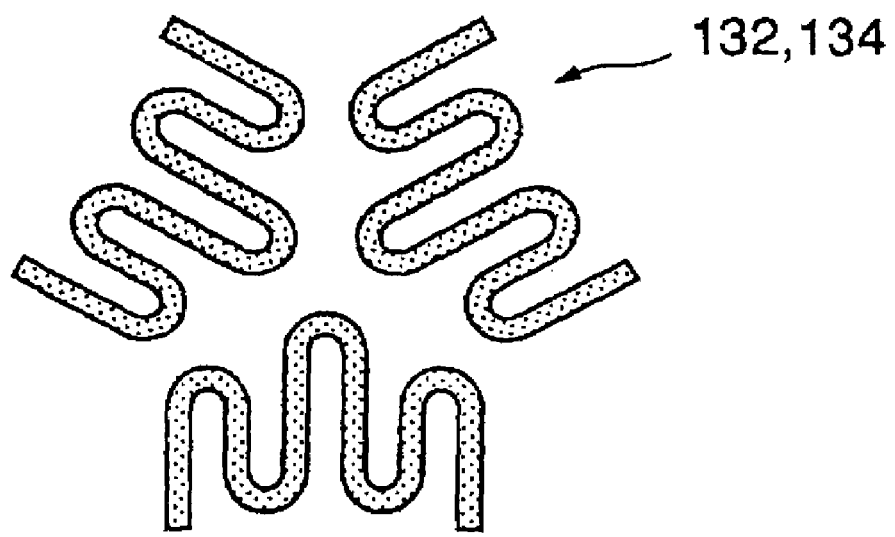
F I G. 7(B)

HEAT TREATMENT SYSTEM

FIELD OF THE INVENTION

This invention relates to a thermal processing unit that conducts a predetermined process to an object to be processed, such as a semiconductor wafer, at a relatively low temperature.

BACKGROUND ART

In general, in order to manufacture a desired semiconductor integrated circuit, various thermal processes including a film-forming process, an etching process, an oxidation process, a diffusion process, a modifying process or the like are carried out to a semiconductor wafer, which consists of a silicon substrate or the like. These thermal processes may be conducted by a longitudinal batch-type of thermal processing unit. In the case, at first, from a cassette that can contain a plurality of, for example 25 semiconductor wafers, semiconductor wafers are conveyed onto a longitudinal wafer boat. For example, 30 to 150 wafers (depending on the wafer size) are placed on the wafer boat in a tier-like manner. The wafer boat is conveyed (loaded) into a processing container that can be exhausted, through a lower portion thereof. After that, the inside of the processing container is maintained at an airtight state. Then, various process conditions including a flow rate of a process gas, a process pressure, a process temperature or the like are controlled to conduct a predetermined thermal process.

Herein, with reference to FIG. 10, an example of a conventional thermal processing unit is explained. The thermal processing unit 2 has a longitudinal processing container 8 with a predetermined length, which has a double-tube structure of an inner tube 4 and an outer tube 6 and is made of quartz. In a processing space S in the inner tube 4, a wafer boat 10 made of quartz is contained as a holder for holding the object to be processed. Semiconductor wafers W as objects to be processed are held on the wafer boat 10 in a tier-like manner at a predetermined interval (pitch).

A cap 12 is provided for opening and closing a lower portion of the processing container 8. A rotation shaft 16, which can rotate via a magnetic-fluid seal 14, is provided at the cap 12. A rotation table 18 is provided on an upper end of the rotation shaft 16. A heat-insulating cylinder 20 is provided on the table 18. The wafer boat 10 is placed on the heat-insulating cylinder 20. The cap 12 is attached to an arm 24 of a boat elevator 22 that can be moved up and down, so that the cap 12 can be moved up and down together with the rotation shaft 16 and the wafer boat 10 and the like. Because of the up-and-down movement by the boat elevator 22, the wafer boat 10 can be inserted into or taken out from the processing container 8 through a bottom portion of the processing container 8.

A manifold 26 made of for example stainless steel is joined to a lower-end opening of the processing container 8. A plurality of (two in the shown example) gas nozzles 28A, 28B penetrates the manifold 26 for introducing various process gases necessary for a thermal process, for example a film-forming process, into the processing container 8. The respective gas nozzles 28A, 28B are connected to respective gas supplying systems 30A, 30B. In the respective gas supplying systems 30A, 30B, flow-rate controllers 32A, 32B such as mass-flow controllers that can control gas flow rates are respectively provided.

Then, the respective process gases supplied from the respective gas nozzles 28A, 28B ascend in the processing space S (wafer containing region) in the inner tube 4, turn down at a ceiling portion and descend in a gap between the inner tube 4 and the outer tube 6.

A gas-discharging port 34 communicating with the gap between the inner tube 4 and the outer tube 6 is provided at a side wall of the manifold 26. A vacuum pump not shown and the like are connected to the gas-discharging port 34. Thus, a vacuum can be created in the processing container 8.

A heat-insulating barrier 36 consisting of a heat-insulating material is provided outside the processing container 8. A heater 38 as a heating means is provided inside the heat-insulating barrier 36. Thus, the wafers W in the processing container 8 are adapted to be heated to a predetermined temperature.

The conventional thermal processing unit 2 is designed to conduct a thermal process, such as a film-forming process or an oxidation-diffusion process, at a relatively high temperature zone of for example 900 to 1200° C. In view of thermal stability at the relatively high temperature zone and so on, the heat-insulating barrier 36 is designed to be relatively thick so as to have large thermal capacity. In addition, in order to rapidly lower the temperature of the processed wafers, a thermal processing unit has been proposed wherein a cool wind is blown to an outside surface of the processing container (for example, JP laid-Open Publication No. 2000-100812).

Recently, it is possible that the semiconductor wafers have to be thermally processed at a relatively low temperature zone of for example 50 to 600° C., instead of the relatively high temperature zone of for example 900 to 1200° C. For example, in order to grant a request of high-speed operation of a semiconductor device, if copper wiring that has been recently paid attention to is formed to reduce wiring resistance, it may be necessary to conduct an annealing process to copper films coated on the wafers at a relatively low temperature of about 50 to 150° C. In addition, in order to reduce wiring capacity, if an organic film whose dielectric constant is small, such as a resin, is used as an interlayer dielectric film, it may be necessary to vitrify the organic film at a relatively low temperature of about 400 to 600° C.

When a thermal process is conducted at the above low temperature zone, if the thermal processing unit 2 as shown in FIG. 6, which is designed for the high temperature zone of for example 900 to 1200° C. and which has the large thermal capacity, is used, it may take a very long time to lower the wafer temperature to a handling temperature that is around a room temperature, even if the thermal process is conducted at the low temperature. For example, as described above, since the heat-insulating barrier 36 is thick and has the large thermal capacity, a rate of temperature fall in the high-temperature zone of about 900 to 1200° C. is 5 to 6° C./min, which is large, but a rate of temperature fall in the low temperature zone of around 100° C. is 1 to 2° C./min, which is very small. The phenomenon in the low temperature zone may be also found in another unit wherein a cooling wind is blown to a side wall of a processing container 8.

If it takes a long time to lower the temperature of the processed wafers to the handling temperature, throughput is remarkably deteriorated.

SUMMARY OF THE INVENTION

This invention is intended to solve the above problems. The object of this invention is to provide a thermal processing unit wherein a rate of temperature fall in a low-temperature zone of for example 50 to 600° C. is high and wherein throughput of a thermal process is improved.

This invention is a thermal processing unit comprising: a tubular processing container; an object-to-be-processed holding unit that holds a plurality of objects to be processed in a tier-like manner and that can be inserted into and taken out from the processing container; a process-gas introducing unit that introduces a predetermined process gas into the processing container; a heating unit provided in the processing container, the heating unit heating the plurality of objects to be processed held by the object-to-be-processed holding unit when the object-to-be-processed holding unit is inserted into the processing container; and a container cooling unit that cools an outside wall surface of the processing container.

According to the invention, since the heating unit is provided in the processing container and the outside wall surface of the processing container is cooled by the container cooling unit, the whole thermal processing unit has smaller thermal capacity. In addition, since the outside wall surface of the processing container can be maintained at a low temperature, a rate of temperature fall of the objects to be processed in a low temperature zone can be remarkably enhanced.

For example, the container cooling unit has: a cooling pipe arranged so as to come in contact with the outside wall surface of the processing container, and a cooling-medium introducing unit that causes a cooling medium to flow into the cooling pipe. In the case, the outside wall surface of the processing container can be efficiently cooled by the cooling medium. In addition, it is preferable that the cooling pipe is wound around the outside wall surface of the processing container.

The cooling pipe may have a double-tube structure having an inner tube and an outer tube, and the cooling medium may be caused to flow into a gap between the inner tube and the outer tube.

In addition, it is preferable that the outside wall surface of the processing container and the cooling pipe are coated with a heat-transfer material. In the case, the heating surface area can be increased, the heat exchange effectiveness can be improved, and the rate of temperature fall can be also improved.

For example, the heat-transfer material is a heat-transfer cement.

In addition, preferably, provided is a cooling-gas introducing unit that introduces a predetermined cooling gas into the processing container when the objects to be processed are cooled. In the case, since the cooling gas can be directly introduced into the processing container by the cooling-gas introducing unit, the rate of temperature fall and characteristics of temperature fall in a low temperature zone can be more improved.

In addition, preferably, a thermal-reflectivity lowering process for lowering thermal reflectivity of an inside wall surface of the processing container may have been conducted to the inside wall surface of the processing container. In the case, since the thermal reflectivity of the inside wall surface of the processing container is lowered, heat in the processing container can be absorbed by the inside wall surface and efficiently discharged outside by the container cooling unit. Thus, cooling efficiency can be improved, so that the rate of temperature fall and the characteristics of temperature fall can be more improved.

For example, the heating unit has a side heater extending in a vertical direction along the inside wall surface of the processing container. Regarding support of the side heater, although a lower portion of the side heater may supported by a bottom portion of the processing container, it is preferable that a upper portion of the side heater is supported by a ceiling portion of the processing container. This is because the ceiling portion of the processing container has relatively large space. In addition, this makes it possible to avoid concentration of pipes or the like at the lower portion of the processing container in which the pipes or the like, such as the process-gas introducing unit and the cooling-gas introducing unit, tend to be concentratedly arranged. In the case, maintenance characteristics at the lower portion of the processing container may be improved.

Preferably, the heating unit has a ceiling heater arranged in a vicinity of a ceiling portion of the object-to-be-processed holding unit inserted into the processing container, the ceiling heater heating the ceiling portion. Similarly, preferably, the heating unit has a bottom heater arranged in a vicinity of a bottom portion of the object-to-be-processed holding unit inserted into the processing container, the bottom heater heating the bottom portion.

In the case, more quantity of heat can be given to the objects to be processed held at the ceiling portion (upper portion) and the bottom portion (lower portion) of the object-to-be-processed holding unit, whose heat discharge tends to be larger than at the central portion. Thus, high temperature-control characteristics can be maintained and temperature uniformity between surfaces of the objects to be processed can be improved.

It is preferable that the ceiling heater is supported by a ceiling portion of the processing container. Similarly, it is preferable that the bottom heater (assistant bottom heater) is also supported by a ceiling portion of the processing container. Alternatively, if the processing container has a lower-end opening and the lower-end opening can be opened and closed by a lid member, the bottom heater may be supported by the lid member.

The processing container consists of quartz, stainless steel or aluminum.

Preferably, the objects to be processed are heated to a range of 50 to 600° C.

BRIEF DESCRIPTION OF THE DRAWINGS

FIG. 2 is a sectional view of the thermal processing unit of the embodiment;

FIG. 3 is a perspective view of a heater rod as a heating unit;

FIGS. 4(A) and 4(B) are graphs showing examples of characteristics of temperature fall of wafers according to the thermal processing unit of the first embodiment of the present invention;

FIGS. 7(A) and 7(B) are plan view showing examples of a shape of a ceiling heater or a bottom heater;

DESCRIPTION OF THE PREFERRED EMBODIMENT

Hereinafter, embodiments of a thermal processing unit according to the present invention are explained with reference to attached drawings.

Figure 1:
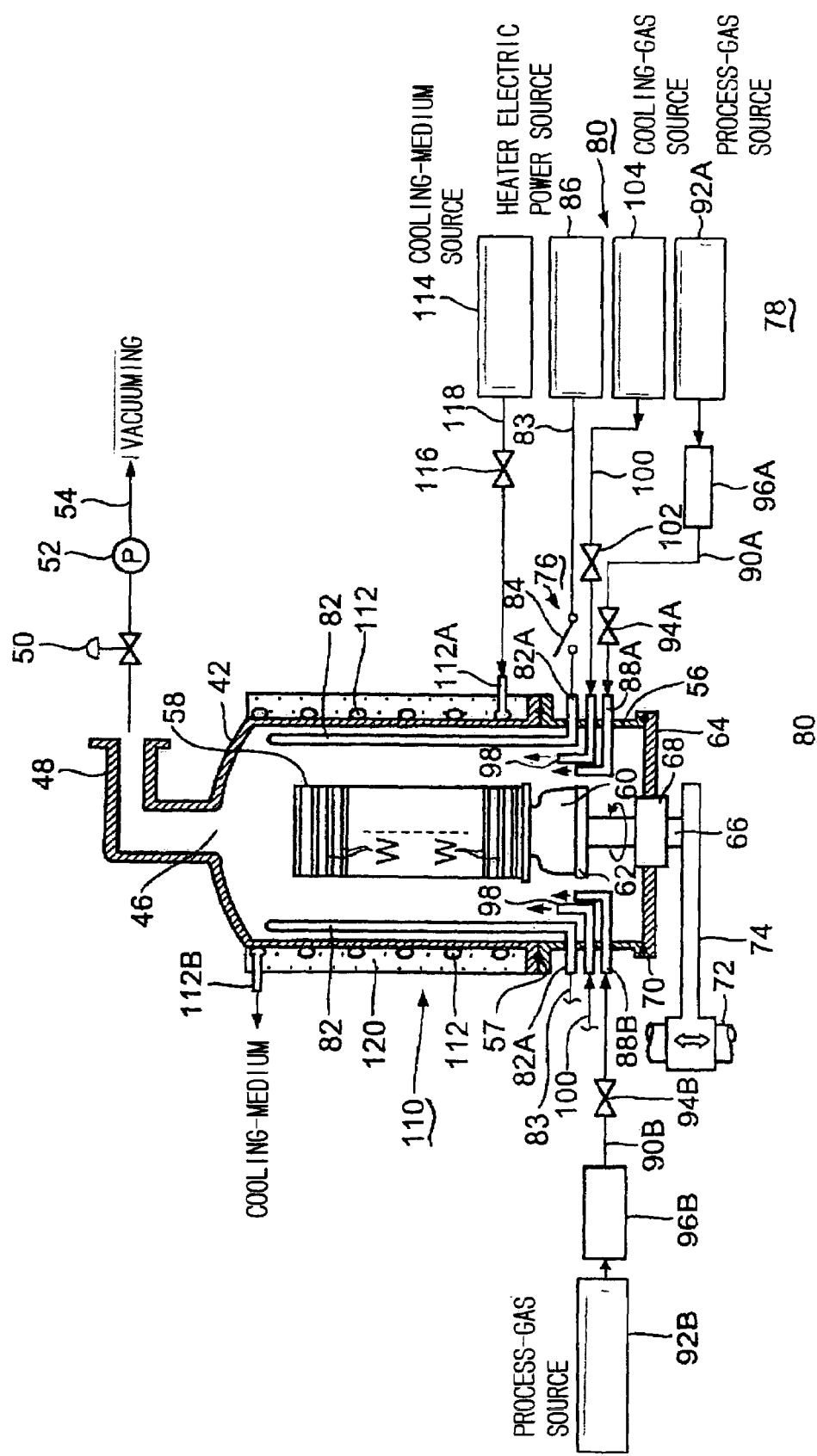
FIG. 1 is a schematic structural view showing a first embodiment of a thermal processing unit according to the present invention.

FIG. 1 is a schematic structural view showing a first embodiment of a thermal processing unit according to the present invention. FIG. 2 is a sectional view of the thermal processing unit of the embodiment.

FIG. 3 is a perspective view of a heater rod as a heating unit.

As shown in FIG. 1, a thermal processing unit 40 of the first embodiment of the invention has a cylindrical processing container 42 whose lower end is open. The processing container 42 may be made of for example quartz or a metal such as stainless steel or aluminum. In a low temperature zone of about 50 to 600° C. as described above, if a process of semiconductor wafers is conducted mainly in a higher zone of about 350 to 600° C., it is preferable that quartz, whose heat resistance is high, is used as a material for the processing container 42. If a process of semiconductor wafers is conducted mainly in a lower zone of about 50 to 350° C., it is preferable that a metal such as stainless steel or aluminum is used as a material for the processing container 42.

An open gas-discharging port 46 is provided at a ceiling part of the processing container 42. A gas-discharging nozzle 48 that has been bent at a right angle in a lateral direction is provided to connect with the gas-discharging port 46. A gas-discharging system 54 including a pressure-control valve 50 and a gas-discharging pump 52 and the like on the way is connected to the gas-discharging nozzle 48. Thus, the atmospheric gas in the processing container 42 can be discharged. Herein, the inside of the processing container 42 may be a vacuum or a substantially normal-pressure atmosphere, depending on a process manner.

A lower end of the processing container 42 is supported by a cylindrical manifold 56 made of for example stainless steel. Under the manifold 56, a wafer boat 58 made of quartz as an object-to-be-processed holding unit, on which a large number of semiconductor wafers W as objects to be processed are placed in a tier-like manner, is provided in a vertically movable manner.

The wafer boat 58 can be inserted into and taken out from the processing container 42, through a lower opening of the manifold 56. In the embodiment, for example about 30 wafers W having 300 mm diameter may be supported in a tier-like manner at substantially the same interval (pitch) by the wafer boat 58. A sealing member 57 such as an O-ring is interposed between a lower end of the processing container 42 and an upper end of the manifold 56. Thus, airtightness between the processing container 42 and the manifold 56 is maintained.

The wafer boat 58 is placed above a table 62 via a heat-insulating cylinder 60 made of quartz. The table 62 is supported on a rotation shaft 66 that penetrates a lid member 64 for opening and closing the lower end opening of the manifold 56.

For example, a magnetic-fluid seal 68 is provided at a penetration part of the lid member 64 by the rotation shaft 66. Thus, the rotation shaft 66 can rotate while maintaining airtightness by the lid member 64. In addition, a sealing member 70 such as an O-ring is provided between a peripheral portion of the lid member 64 and a lower end portion of the manifold 56. Thus, airtightness between the lid member 64 and the manifold 56 is maintained, so that airtightness in the processing container 42 is maintained.

The rotation shaft 66 is attached to a tip end of an arm 74 supported by an elevating mechanism 72 such as a boat elevator. When the elevating mechanism 72 is moved up and down, the wafer boat 58 and the lid member 64 and the like may be integrally moved up and down.

Herein, the table 62 may be fixed on the lid member 64. In the case, the wafer boat 58 doesn't rotate while the process to the wafers W is conducted.

A heating unit 76 for heating the semiconductor wafers W, a process-gas introducing unit 78 for introducing a predetermined process gas into the processing container 42, and a cooling-gas introducing unit 80 as one feature of the present invention are respectively provided at a side portion of the manifold 56.

Specifically, for example as shown in FIG. 3, the heating unit 76 has a long heater rod 82 that extends vertically and whose upper portion is bent in a U-shape. As shown in FIGS. 1 and 2, a plurality of heater rods 82, eight heater rods 82 in the case shown in FIG. 2, are provided substantially uniformly in a circumferential direction of the processing container 42. Of course, the number of heater rods is not limited. The length of the heater rod 82 is greater than height of the wafer boat 58. Each heater rod 82 is arranged along an inside wall surface of the processing container 42 and away from the inside wall surface by a slight distance. A lower end portion 82A of the heater rod 82 is bent at a substantially right angle in a L-shape. The lower end portion 82A is fixed to the manifold 56. Thus, the whole heater rod 82 is supported.

For example, a carbon wire heater wherein a carbon wire is covered with a quartz layer can be used as the heater rod 82. Each heater rod 82 is connected to a heater electric power source 86 via a feeder line 83 and a switching mechanism 84.

The process-gas introducing unit 78 has a plurality of, two in the shown example, process-gas nozzles 88A, 88B that penetrate the manifold 56. The process-gas nozzles 88A, 88B are respectively connected to process-gas sources 92A, 92B via process-gas lines 90A, 90B. In the respective process-gas lines 90A, 90B, on-off valves 94A, 94B and flow-rate controllers 96A, 96B such as mass-flow controllers are respectively provided. Necessary numbers of the process-gas nozzles 88A, 88B and the like are provided depending on the number of kinds of necessary gases. The tip end portion of each process-gas nozzle 88A, 88*b* is bent upwardly.

In addition, as shown in FIGS. 1 and 2, the cooling-gas introducing unit 80 has a plurality of, eight in the shown example, cooling-gas nozzles 98 that penetrate the manifold 56. These gas nozzles 98 are arranged substantially uniformly (at substantially the same pitch) in a circumferential direction of the manifold 56. The tip end portion of each cooling-gas nozzle 98 is bent upwardly. Each cooling-gas nozzle 98 is connected to a cooling-gas source 104 via a cooling-gas line 100 including an on-off valve 102 on the way. As described below, a cooling gas is adapted to be ejected from each cooling-gas nozzle 98 into the processing container 42 in order to lower the temperature of the wafers after the thermal process.

As the cooling gas, an inert gas such as an $N_2$ gas, an Ar gas or a He gas, or a clean air or the like may be used. In addition, if a cooling mechanism not shown is provided in the cooling-gas line 100 to cool the cooling gas to a lower temperature before ejection of the cooling gas, a rate of temperature fall of the wafers can be more enhanced.

In addition, a container cooling unit 110 for cooling the processing container 42 itself is provided at the processing container 42. Specifically, the container cooling unit 110 of the embodiment has a cooling pipe 112 closely and for example spirally wound around an outside wall surface of the processing container 42. The cooling pipe 112 is made of a material whose heat conductivity is good, such as copper, and is wound over substantially the whole height of the processing container 42.

One end of the cooling pipe 112 is formed as a cooling-medium introducing port 112A, and the other end is formed as a cooling-medium discharging port 112B. Then, the cooling-medium introducing port 112A is connected to a cooling-medium source 114 via a cooling-medium way 118 including an on-off valve 116 on the way. For example, cooling water may be used as the cooling medium. However, the cooling medium is not limited thereto. It is preferable that the cooling medium is repeatedly used by means of a circulation way.

In the present embodiment, a heat-transfer cement 120 whose heat conductivity is good and that has a predetermined thickness is attached onto the outside wall surface of the processing container 42 in such a manner that the cooling pipe 112 is buried in the-heat-transfer cement 120. Thus, the side wall of the processing container 42 can be more efficiently cooled when necessary.

Next, a thermal processing method carried out by using the thermal processing unit of the embodiment as described above is explained. Herein, as a thermal process, an annealing process for copper films formed on wafer surfaces is explained as an example.

When the semiconductor wafers W are unloaded and the thermal processing unit is under a waiting state, the processing container 42 is maintained at a temperature, for example about 50° C., which is lower than a process temperature. Then, the wafer boat 58 on which a large number of, for example thirty, wafers W at a normal temperature are placed is moved up and loaded into the processing container 42 from the lower portion thereof. The lid member 64 closes the lower end opening of the manifold 56, so that the inside of the processing container 42 is hermetically sealed.

Then, the inside of the processing container 42 is vacuumed and maintained at a predetermined process pressure, for example about 100 Pa. On the other hand, electric power supplied to the heater rods 82 of the heating unit 76 is increased so that the wafer temperature is raised and stabilized at a process temperature for the annealing process, for example about 150° C. After that, an $H_2$ gas as a predetermined process gas is supplied from one process-gas nozzle (for example 88A) of the process-gas introducing unit 78 while a flow rate of the $H_2$ gas is controlled.

The $H_2$ gas ascends in the processing container 42 and comes in contact with the wafers W contained in the rotating wafer boat 58. Thus, the annealing process is conducted to the copper films of the wafer surfaces. Then, the $H_2$ gas is discharged outside from the gas-discharging port 46 at the ceiling part of the processing container 42.

During the thermal process (annealing process), a cooling medium such as cooling water may be caused to flow into the cooling pipe 112 of the container cooling unit 110 provided on the side wall of the processing container 42. In the case, the side wall of the container may be cooled. If the cooling medium such as cooling water is not caused to flow, the thermal efficiency of the process may be enhanced.

When the thermal process for a predetermined time is completed, the electric power supplied to the heater rods 82 is controlled or stopped. Then, a cooling operation is conducted.

The cooling medium continues to be caused to flow into the cooling pipe 112 of the container cooling unit 110 (if the cooling medium has not been caused to flow during the thermal process, the cooling medium starts to be caused to flow), so that the side wall of the processing container 42 continues to be cooled.

The supply of the process gas from the process-gas nozzle 88A of the process-gas introducing unit 78 is stopped. On the other hand, from each cooling-gas nozzle 98 of the cooling-gas introducing unit 80, the cooling gas (for example, an $N_2$ gas or a clean air) is ejected into the processing container 42. Thus, the cooling of the wafers W is promoted.

As described above, the side wall of the processing container 42 is directly cooled by causing the cooling water or the like to flow into the cooling pipe 112, and the thermal capacity of the whole heating furnace including the processing container 42 and the heat-transfer cement 120 and the like is small. Thus, the wafers W may be efficiently cooled, that is, the rate of temperature fall of the wafers W may be increased.

In the present embodiment, the cooling pipe 112 is buried in the heat-transfer cement 120, so that the thermal conductivity between the side wall of the processing container 42 and the cooling pipe 112 is greatly increased. Thus, the temperature of the processing container 42 may be lowered more rapidly.

In addition, at the same time as the cooling by the cooling pipe 112, the cooling gas is introduced into the processing container 42 from the lower portion thereof, and the cooling gas directly contacts with the processed wafers W to cool them. Thus, the temperature of the wafers W may be lowered more rapidly, that is, the rate of temperature fall of the wafers W may be increased more.

In addition, if a thermal-reflectivity lowering process for lowering thermal reflectivity of the inside wall surface of the processing container 42 has been conducted to the inside wall surface of the processing container 42 in advance, heat absorptivity of the side wall of the processing container 42 is increased. In the case, the temperature in the processing container 42 and the temperature of the wafers W may be lowered more rapidly. As a thermal-reflectivity lowering process, there are a blacking process to the inside wall surface of the container, a process of making rough the inside wall surface of the container by sandblasting or the like, and the like.

A metal tube having a double-tube structure may be used as the container cooling unit 110, and a cooling medium may be caused to flow between the double tubes.

Although the heater rods 82 are provided in the processing container 42, there is no fear that the wafers are metal contaminated because the process temperature is low, the process is the annealing process for the copper films, and the surfaces of the heater rods 82 are covered with the quartz and the like.

Herein, an evaluation test was actually conducted regarding when the wafers are cooled in the above thermal processing unit 40. The evaluation result is explained.

FIG. 4 is graphs showing characteristics of temperature fall of the semiconductor wafers. FIG. 4(A) shows characteristics of temperature fall when the cooling water flows into the cooling pipe but the cooling gas is not ejected. FIG. 4(B) shows characteristics of temperature fall when the cooling water flows into the cooling pipe and the cooling gas is ejected into the processing container. Herein, the shown characteristics are those when the wafer temperature is lowered from about 150° C. to a room temperature. The flow rate of the cooling water was 5 liters/min, the cooling gas was a clean air, and the flow rate of the cooling gas was 666 liters/min, in common.

As shown in FIG. 4(A), when the cooling gas was not ejected and only the cooling water was used, the temperature fall traced a relatively mild curve. However, in the higher temperature zone, the rate of temperature fall was higher than in the lower temperature zone. For example, from 150° C. to 100° C., the rate of temperature fall was 5.9° C./min, while from 150° C. to 50° C. the rate of temperature fall was 4.3° C./min. The rate of temperature fall of the case is much higher than the rate of temperature fall of 1 to 2° C./min at the conventional thermal processing unit shown in FIG. 6. That is, it was found that an enough high rate of temperature fall can be obtained even if the cooling gas is not used.

On the other hand, as shown in FIG. 4(B), when both the cooling gas and the cooling medium were used, the temperature fall traced a relatively sharp curve. That is, the degree of temperature fall was very great. For example, from 150° C. to 100° C., the rate of temperature fall was 15.2° C./min, while from 150° C. to 50° C. the rate of temperature fall was 11.1° C./min. In the case, it was found that a very high rate of temperature fall can be obtained even compared with the case shown in FIG. 4(A).

Thus, the unit 40 of the present embodiment can lower the temperature of the processed wafers more rapidly; thereby the throughput may be remarkably improved.

Figure 5:
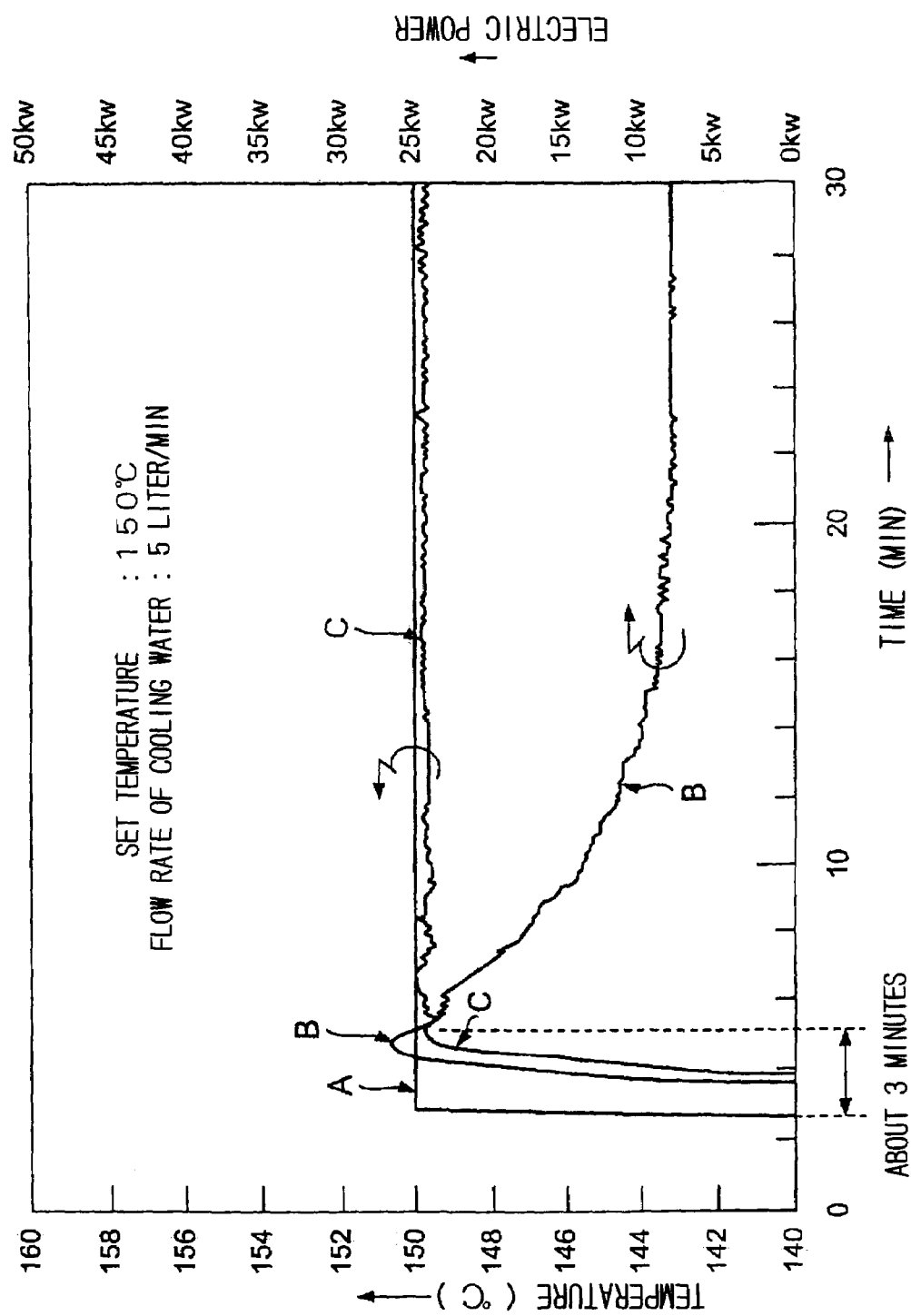
FIG. 5 is a graph showing wafer temperatures when the wafers are heated.

In addition, an evaluation test was conducted regarding a heating operation of the wafer temperature at a start of the thermal process to the wafers. The evaluation result is explained. FIG. 5 is a graph showing an evaluation result when the wafer temperature is raised. In FIG. 5, a line A shows a set value from a computer of a temperature controlling system, a curve B shows electric power supplied to the heater rods 82, and a curve C shows the wafer temperature. The set temperature was 150° C., and the flow rate of the cooling water was 5 liters/min.

According to the curve C in the graph, within about three minutes from the start of heating (shorter than a target value, 10 minutes), the wafer temperature reached a temperature in the vicinity (not less than 90%) of the set temperature of 150° C. That is, it was found that the rate of temperature rise is also high enough and is maintained at substantially the same value as at the conventional unit.

Next, a second embodiment of the present invention is explained.

Figure 6:
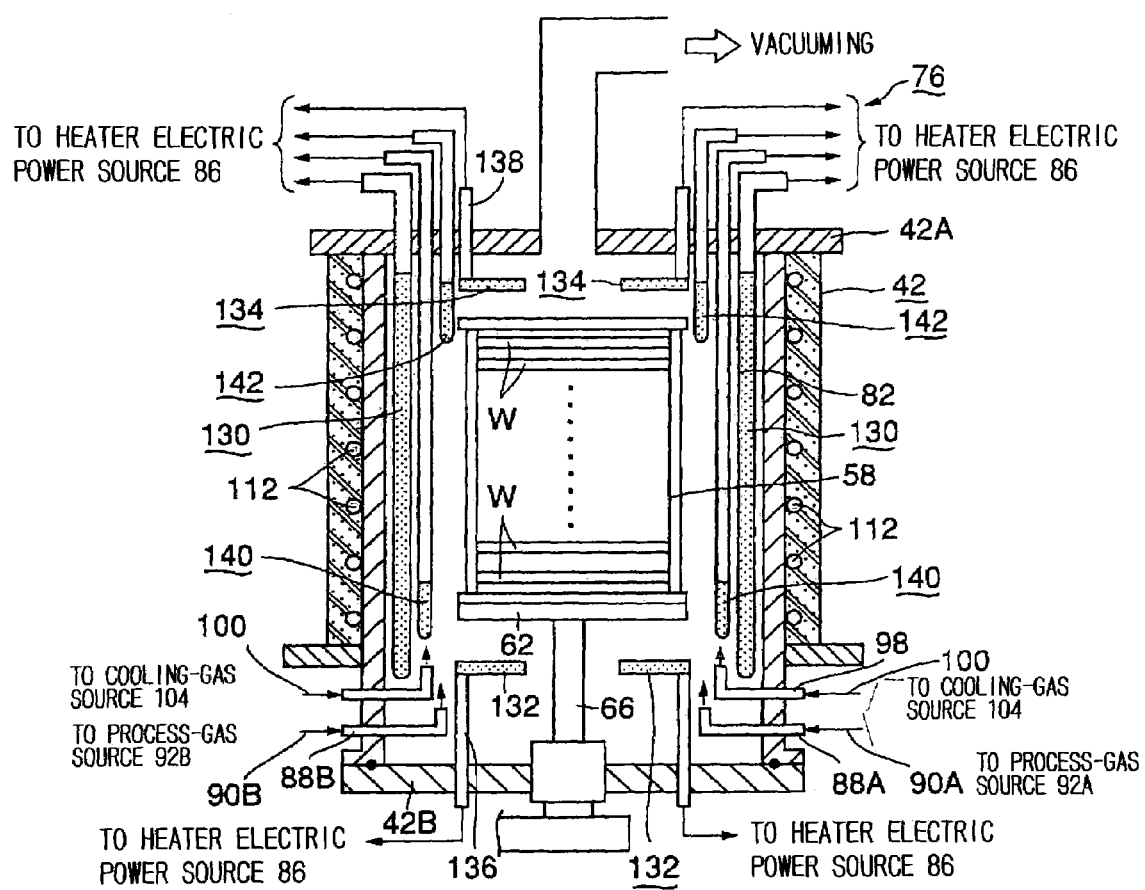
FIG. 6 is a schematic structural view showing a second embodiment of a thermal processing unit according to the present invention.

FIG. 6 is a schematic structural view showing the second embodiment of a thermal processing unit according to the present invention. FIGS. 7(A) and 7(B) are plan view showing shapes of a ceiling heater and a bottom heater. The same parts as explained with reference to FIG. 1 are represented by the same numeral signs, and the explanation thereof is omitted.

In the second embodiment, a material for the processing container 42 is limited to a metal, so that a time necessary for temperature stabilization is shortened. In addition, the number of heaters in the heating unit 76 is increased, so that the uniformity between wafer surface temperatures during the process is improved.

That is, the processing container 42 of the embodiment is made of a metal material that doesn't cause metal contamination, such as stainless steel or anodized aluminum. The ceiling part 42A of the processing container 42 and the lid member 42B for opening and closing the lower end opening of the processing container 42 are also made of the same metal material. Then, the height and the diameter of the processing container 42 are respectively about 900 mm and about 500 mm. Thus, the volume of the processing container 42 is about 173 liters.

In addition, the rotation table 62 for supporting the wafer boat 58 and an upper portion of the rotation shaft 66 connected to the rotation table 62 are made of a heat-resistant material whose thermal conductivity is low, such as quartz. For example, wafers W of 300 mm diameter are supported by the wafer boat 58. In the present embodiment, the heat-insulating cylinder 60 (see FIG. 1) used in the first embodiment shown in FIG. 1 is not used.

As the heating unit 76 of the present embodiment, as described below, a plurality of kinds of heaters are used. In FIG. 6, heating areas of the heaters are shown by dots.

The heaters of the present embodiment are explained in detail.

At first, the same heater rods 82 as shown in FIG. 3 are vertically arranged along the inside wall surface of the processing container 42. In the same manner as explained with reference to FIG. 2, a large number of heater rods 82 are arranged at a predetermined interval in a circumferential direction of the processing container 42, in order to form a side heater 130. This feature is the same as the first embodiment explained with reference to FIG. 1. However, in the present invention, the heater rods 82 are not supported by the side wall of the bottom portion of the processing container 42, but supported by the ceiling portion 42A of the processing container 42.

In addition, in the present embodiment, a bottom heater 132 is arranged at a bottom portion of the processing container 42 and a ceiling heater 134 is arranged at a ceiling portion thereof.

The bottom heater 132 is arranged under the rotation table 62 in such a manner that the bottom heater 132 confronts the rotation table 62 in parallel. Thus, a large amount of heat can be given to the lowermost wafer W, among the wafers W contained in the wafer boat 58 in a tier-like manner.

In addition, the ceiling heater 134 is arranged to confront an upper end surface of the wafer boat 58 in parallel. Thus, a large amount of heat can be given to the uppermost wafer W, among the wafers W contained in the wafer boat 58 in a tier-like manner.

The bottom heater 132 is supported by and fixed to the lid member 42B via a pillar 136 including a cable, and is connected to the heater electric power source 86 (see FIG. 1). On the other hand, the ceiling heater 134 is supported by and fixed to the ceiling portion 42A of the processing container 42 via a pillar 138 including a cable, and is connected to the heater electric power source 86.

As the bottom heater 132 or the ceiling heater 134, as shown in FIG. 7(A), a doughnut-like plane heater plate may be used. Alternatively, as shown in FIG. 7(B), the bottom heater 132 or the ceiling heater 134 may consist of a plurality of (three in the case of FIG. 7(B)) wire-carbon heater elements, each of which is meanderingly bent in a plane.

Regarding the heater 132 or 134, in order not to cause metal contamination to the wafers W, the surface thereof may be coated with high-purity quartz or the main heater body thereof may be contained in a quartz tube.

In addition, as the bottom heater 132, a heater may be used wherein a resistance heating wire consisting of a high-purity carbon material is sealed in a quartz plate, which is described in JP Laid-Open Publication No. 2001-156005. The bottom heater 132 may be formed integrally with the rotation table 62.

If the above bottom heater 132 and/or the ceiling heater 134 are provided, a larger amount of heat can be given to the bottom portion and/or the upper portion of the wafer boat 58, whose heat discharge tends to be larger than at the central portion thereof. Thus, the uniformity between surface temperatures of the (for example, about twenty-five) wafers W placed on the wafer boat 58 in a tier-like manner can be maintained at a high level.

If the amount of heat to be given is not enough even with the above bottom heater 132 and/or the ceiling heater 134, an assistant bottom heater 140 and/or an assistant ceiling heater 142 may be additionally provided. The assistant bottom heater 140 and the assistant ceiling heater 142 may be fixed by using an upper space of the processing container 42 that has a running room. That is, the upper end portions of the heaters 140 and 142 may be supported by the container ceiling portion 42A. More specifically, a heating area of the assistant bottom heater 140 may be arranged along the inside wall surface of a lower portion of the processing container 42, and a heating area of the assistant ceiling heater 142 may be arranged along the inside wall surface of an upper portion of the processing container 42. Thus, the wafers W in the vicinity of the lower end and the wafers W in the vicinity of the upper end may be respectively heated more strongly.

The assistant bottom heater 140 and the assistant ceiling heater 142 have the heating areas shown by dots, as described above. The other conducting portions have small resistance. (For example, the diameter is enlarged to reduce the resistance.) Thus, the other conducting portions generate no heat. Regarding the assistant bottom heater 140 and/or the assistant ceiling heater 142, in order not to cause metal contamination to the wafers W, it is preferable that the whole heater is coated with a quartz cover or the like.

In addition, a thermal-reflectivity lowering process may be conducted to the inside wall surface of the processing container 42. Alternatively, without conducting the thermal-reflectivity lowering process, to the contrary, a thermal-reflectivity raising process may be conducted by an electro polishing or a chromium plating or the like. For example, if the process temperature is in a very low temperature zone of about 50 to 400° C. and the control for temperature stabilization is very difficult, it is effective to conduct the thermal-reflectivity lowering process to facilitate the control for temperature stabilization but to sacrifice the thermal efficiency. To the contrary, if the process temperature is in a normal low temperature zone of about 400 to 600° C., since the control for temperature stabilization is easy, it is effective to conduct the thermal-reflectivity raising process to improve the thermal efficiency.

Then, an operation of the thermal processing unit of the second embodiment is explained.

The basic operation of the thermal processing unit of the embodiment is substantially the same as that of the first embodiment. According to the second embodiment, since the number of heaters of the heating unit 76 is large, a higher rate of temperature rise may be achieved. For example, under current operating conditions, a rate of temperature rise of 200° C./min may be obtained at most. If the supplied electric power is reduced, the lower limit of a rate of temperature rise may be reduced to a required small value.

In the thermal processing unit of the second embodiment, for example when the wafer boat 58 is both moved down (unloaded state) and moved up into the processing container 42 (loaded state), the cooling water is always caused to flow into the cooling pipe 112, so that the processing container 42 may be cooled to a room temperature. In addition, when the wafer boat 58 holding for example twenty-five wafers W is moved up and loaded into the processing container 42, electric power starts to be supplied at a full power to all the heaters of the heating units 76 that have been turned off until then, that is, the side heater 130, the bottom heater 132 and the ceiling heater 134, and the assistant bottom heater 140 and the assistant ceiling heater 142 if they are provided. Thus, the wafers W are heated to the process temperature.

In a general processing system wherein the processing container is not cooled, the wafer temperature overshoots so greatly that it takes a long time for the wafer temperature to stabilize at a process temperature. On the other hand, according to the embodiment, since the processing container 42 is cooled, the responsibility of the temperature control is so good that the level of overshooting is inhibited. Thus, it is possible to stabilize the wafer temperature at a process temperature within a shorter time.

In addition, in the embodiment, by providing the bottom heater 132 and the ceiling heater 134, and by providing the assistant bottom heater 140 and the assistant ceiling heater 142 if they are necessary, an amount of heat supplied to the upper end portion and the lower end portion of the wafer boat 58, where an amount of heat discharge tends to be larger than at the central portion thereof, is increased. Thus, the uniformity between wafer surface temperatures during the heating step and during the process may be enhanced. Thus, it is possible to make substantially even thermal history of all the wafers W placed on the wafer boat 58.

When the process is completed, the electric power supplied to all the heaters 132, 134, 140 and 142 is stopped. The feature wherein the cooling gas such as an N₂ gas is ejected from the cooling-gas nozzle 98 is the same as the first embodiment.

Herein, an evaluation test was conducted regarding when the temperature is raised in the thermal processing unit of the second embodiment. The evaluation result is explained.

In the thermal processing unit of the present embodiment used for the evaluation test, as the heating unit 176, the side heater 130, the bottom heater 132, the ceiling heater 134 and the assistant bottom heater 140 were provided, but the assistant ceiling heater 142 was not provided. In addition, a thermal-reflectivity lowering process has been conducted to the inside wall surface of the processing container 42.

Figure 8:
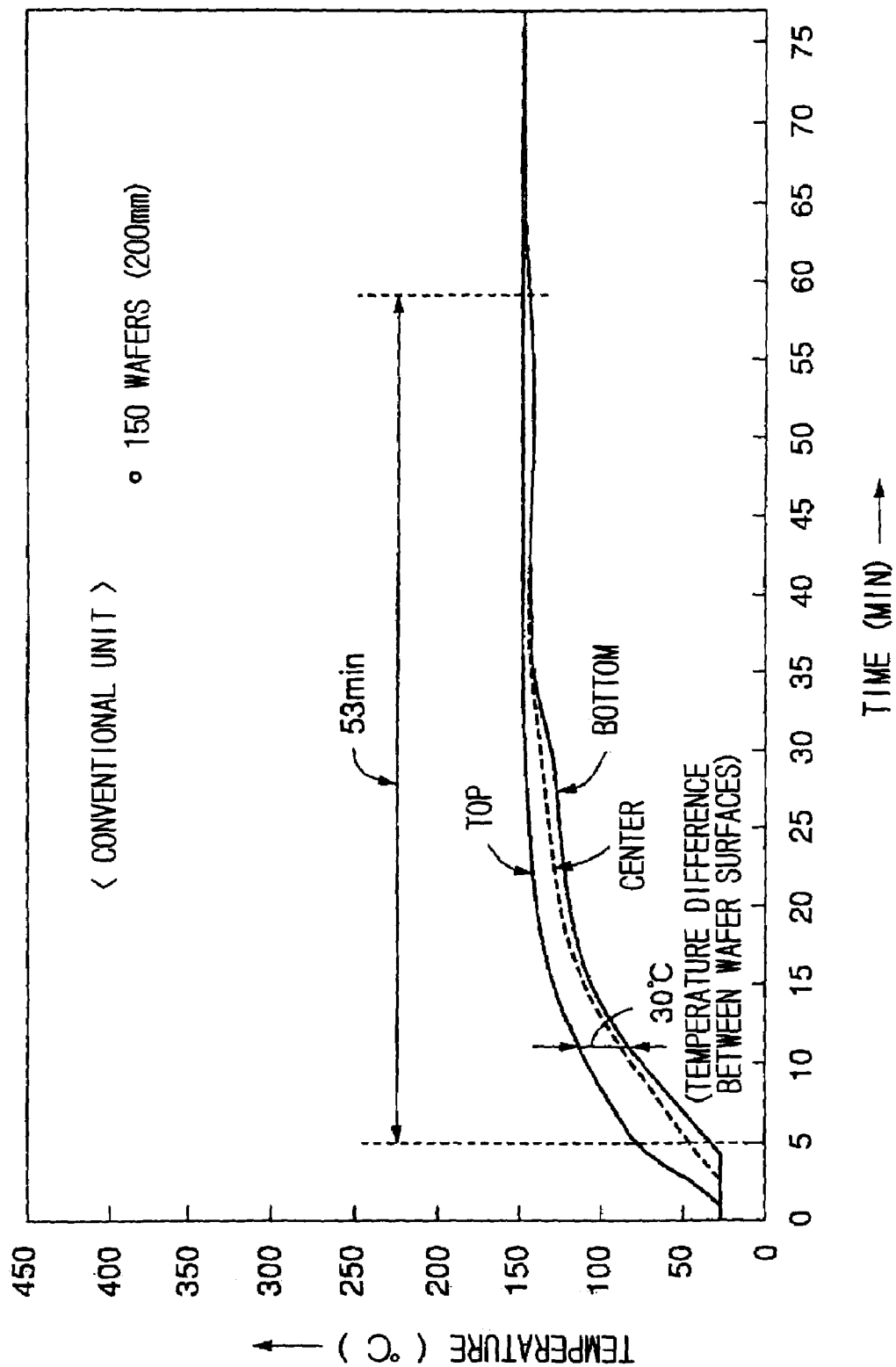
FIG. 8 is a graph showing characteristics of temperature rise of wafers according to a conventional unit.
Figure 9:
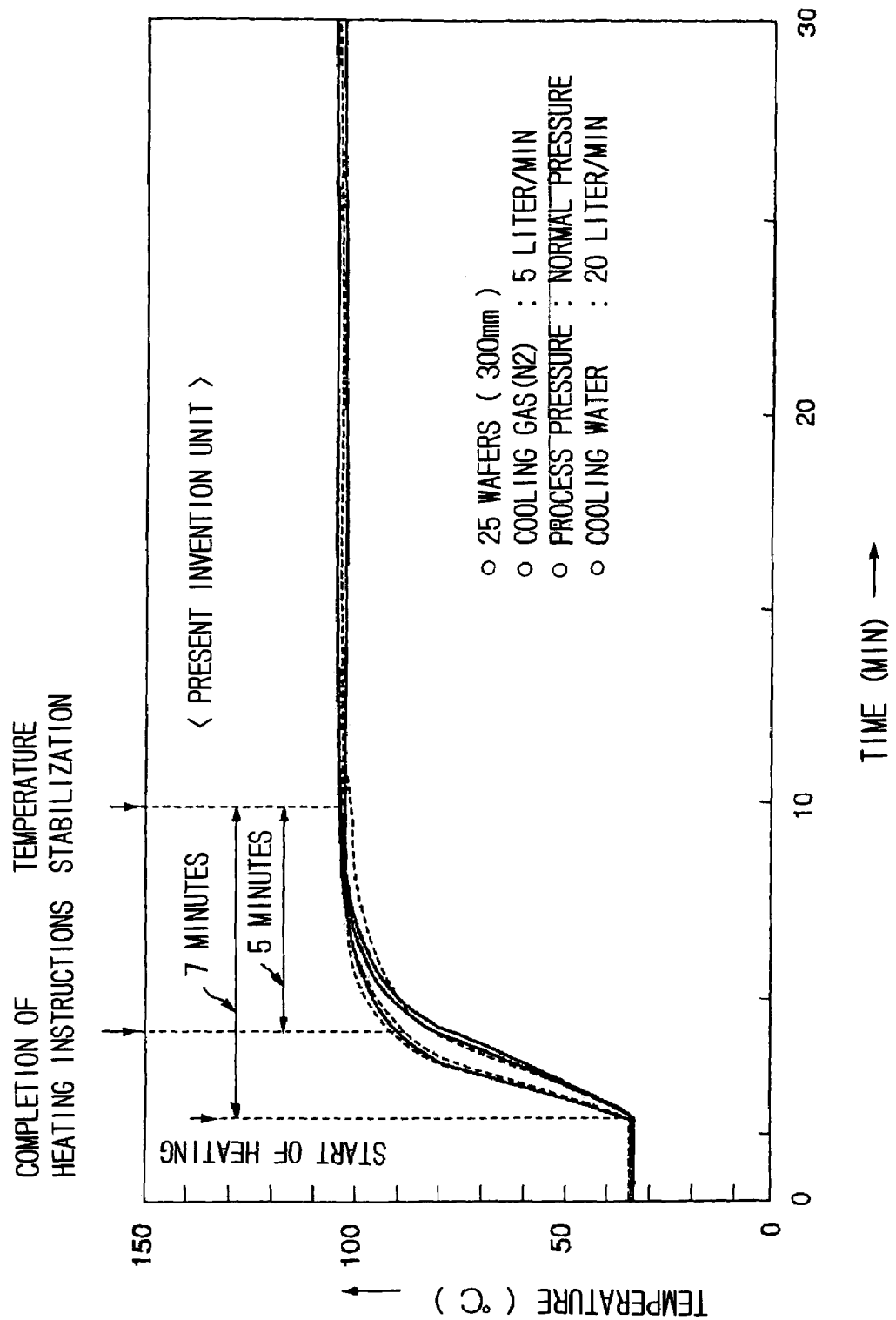
FIG. 9 is a graph showing characteristics of temperature rise of wafers according to the thermal processing unit of the second embodiment of the present invention.
Figure 10:
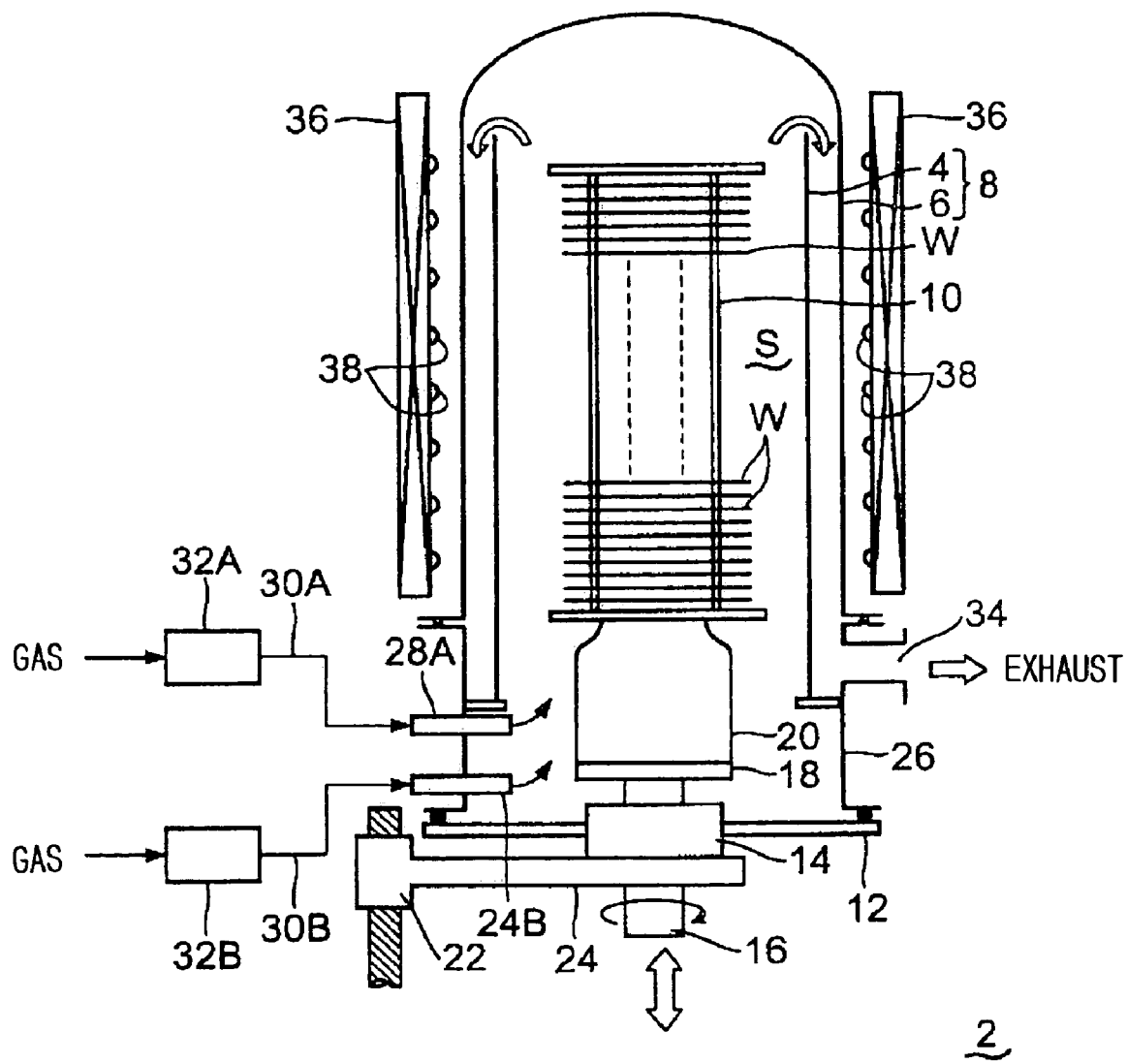
FIG. 10 is a schematic structural view showing an example of a conventional thermal processing unit.

FIG. 8 is a graph showing characteristics of temperature rise of wafers according to a conventional unit. FIG. 9 is a graph showing characteristics of temperature rise of wafers according to the thermal processing unit of the present embodiment. The set temperature was 150° C. for the conventional unit and 100° C. for the embodiment unit. (Since the conventional unit is not taken into consideration the use for a process at a very low temperature of about 100° C., as the set temperature, 150° C. was adopted, which is a lower limit controllable by the conventional unit.) In addition, the wafer size was 200 mm (8 inches) for the conventional unit and 300 mm (12 inches) for the embodiment unit. The conventional unit contained one hundred and forty wafers, and the embodiment unit contained twenty-five wafers.

Regarding the conventional unit, thermocouples were respectively provided at the fourth uppermost wafer as TOP, at the 70-th uppermost wafer as CENTER and at the 136-th uppermost wafer as BOTTOM, to measure temperatures thereof. On the other hand, regarding the embodiment unit, thermocouples were respectively provided at the uppermost wafer, at the seventh uppermost wafer, at the sixteenth uppermost wafer and at the 25-th uppermost wafer, to measure temperatures thereof. The thermocouples were provided at a central portion and a peripheral portion for each of the above wafers to measure the temperature difference between the central portion and the peripheral portion.

Herein, in the embodiment unit, the process pressure was a normal pressure, the flow rate of the cooling water was 20 liters/min, and the flow rate of the $N_2$ gas at the cooling step was 5 liters/min.

As shown in FIG. 8, according to the conventional unit, from the start of heating, it took 53 minutes for the wafer temperature to enter a range of 150° C. ±5° C. This time may remarkably deteriorate the throughput. In addition, during the heating step, the maximum temperature difference between the wafer surfaces was 30° C., and the state continued for a long time of about 20 to 30 minutes. That is, it was found that the thermal history of the wafers may be different to a great extent. Herein, the wafers were loaded under a condition wherein the processing container 42 was maintained at 150° C.

On the other hand, as shown in FIG. 9, according to the embodiment unit, from the start of heating, it took only about 7 minutes for the wafer temperature to enter a range of 100° C. ±5° C. In addition, from the completion of heating instructions, it took only about 5 minutes for the wafer temperature to enter the temperature stabilization zone. That is, it was found that it is possible to rapidly heat the wafers to a predetermined process temperature. Herein, the rate of temperature rise was 50° C./min.

The reason why the process temperature is stabilized within only about 5 minutes from the completion of heating instructions in the embodiment unit is because the wall surface of the processing container 42 is cooled by the cooling water during the heating step so that the degree of overshooting of the wafer temperature may be inhibited and temperature control characteristics are improved.

In addition, in the embodiment unit, the maximum temperature difference between the wafer surfaces during the heating step was several degrees. That is, it was found that the uniformity of the wafer temperature between wafer surfaces (including during the process) may be remarkably improved.

In addition, the temperature difference between the central portion and the peripheral portion of the wafer during the heating step was increased to 15° C. at most. However, the state continued only for 2 or 3 minutes, so that the wafers were not affected badly thereby.

As described above, when the bottom heater 132 and the ceiling heater 134 and the like are provided in addition to the side heater 130 as the second embodiment, the uniformity between wafer surface temperatures during the heating step and during the process may be greatly improved.

The above embodiments are explained for the annealing process to the copper films. However, the thermal process is not limited unless it causes a problem of metal contamination or the like. For example, in a thermal process for vitrificating a resin layer as an interlayer dielectric film, the process temperature is about 300 to 600° C., and an $NH_3$ gas or the like is used as a process gas.

The object to be processed is not limited to the semiconductor wafer, but may be a glass substrate, a LCD substrate or the like.

The invention claimed is:

1. A thermal processing unit comprising:
    a tubular processing container,
    an object-to-be-processed holding unit that holds a plurality of objects to be processed in a tier-like manner and that can be inserted into and taken out from the processing container,
    a process-gas introducing unit that introduces a predetermined process gas into the processing container,
    a heating unit provided in the processing container, the heating unit heating the plurality of objects to be processed held by the object-to-be-processed holding unit when the object-to-be-processed holding unit is inserted into the processing container, and
    a container cooling unit that cools an outside wall surface of the processing container, wherein
    a thermal-reflectivity lowering process for lowering thermal reflectivity of an inside wall surface of the processing container has been conducted to the inside wall surface of the processing container.

2. A thermal processing unit according to claim 1, wherein the container cooling unit has:
    a cooling pipe arranged so as to come in contact with the outside wall surface of the processing container, and
    a cooling-medium introducing unit that causes a cooling medium to flow into the cooling pipe.

3. A thermal processing unit according to claim 2, wherein the cooling pipe is wound around the outside wall surface of the processing container.

4. A thermal processing unit according to claim 2, wherein the cooling pipe has a double-tube structure having an inner tube and an outer tube, and
    the cooling medium is caused to flow into a gap between the inner tube and the outer tube.

5. A thermal processing unit according to claim 2, wherein the outside wall surface of the processing container and the cooling pipe are coated with a heat-transfer material.

6. A thermal processing unit according to claim 5, wherein the heat-transfer material is a heat-transfer cement.

7. A thermal processing unit according to claim 1, further comprising
    a cooling-gas introducing unit that introduces a predetermined cooling gas into the processing container when the objects to be processed are cooled.

8. A thermal processing unit according to claim 1, wherein the heating unit has a side heater extending in a vertical direction along the inside wall surface of the processing container.

9. A thermal processing unit according to claim 8, wherein a upper portion of the side heater is supported by a ceiling portion of the processing container.

10. A thermal processing unit according to claim 1, wherein
    the heating unit has a ceiling heater arranged in a vicinity of a ceiling portion of the object-to-be-processed holding unit inserted into the processing container, the ceiling heater heating the ceiling portion.

11. A thermal processing unit according to claim 10, wherein
    the ceiling heater is supported by a ceiling portion of the processing container.

12. A thermal processing unit according to claim 1, wherein
the heating unit has a bottom heater arranged in a vicinity of a bottom portion of the object-to-be-processed holding unit inserted into the processing container, the bottom heater heating the bottom portion.

13. A thermal processing unit according to claim 12, wherein
the processing container has a lower-end opening,
the lower-end opening can be opened and closed by a lid member, and
the bottom heater is supported by the lid member.

14. A thermal processing unit according to claim 12, wherein
the bottom heater is supported by a ceiling portion of the processing container.

15. A thermal processing unit according to claim 1, wherein
the processing container consists of quartz, stainless steel or aluminum.

16. A thermal processing unit according to claim 1, wherein the objects to be processed are heated to a range of 50 to 600° C.

17. A thermal processing unit comprising:
a tubular processing container,
an object-to-be-processed holding unit that holds a plurality of objects to be processed in a tier-like manner and that can be inserted into and taken out from the processing container,
a process-gas introducing unit that introduces a predetermined process gas into the processing container,
a heating unit provided in the processing container, the heating unit heating the plurality of objects to be processed held by the object-to-be-processed holding unit when the object-to-be-processed holding unit is inserted into the processing container, and
a container cooling unit that cools an outside wall surface of the processing container, wherein
the heating unit has a side heater extending in a vertical direction along the inside wall surface of the processing container, and wherein
a lower portion of the side heater is supported by a bottom portion of the processing container.

* * * * *